(12) United States Patent
Kim (10) Patent No.: US 6,744,319 B2
(45) Date of Patent: Jun. 1, 2004

(54) EXPONENTIAL FUNCTION GENERATOR EMBODIED BY USING A CMOS PROCESS AND VARIABLE GAIN AMPLIFIER EMPLOYING THE SAME

(75) Inventor: Seong-Ryeol Kim, Ichon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 50 days.

(21) Appl. No.: 10/180,309

(22) Filed: Jun. 27, 2002

(65) Prior Publication Data

US 2003/0112072 A1 Jun. 19, 2003

(30) Foreign Application Priority Data

Dec. 13, 2001 (KR) ......................................... 2001-78806

(51) Int. Cl.[7] .............................................. H03F 3/45
(52) U.S. Cl. ....................................... 330/254; 330/253
(58) Field of Search ................................. 330/254, 253

(56) References Cited

U.S. PATENT DOCUMENTS

| | | | | |
|---|---|---|---|---|
| 5,572,166 A | * | 11/1996 | Gilbert | ........................ 330/254 |
| 5,757,230 A | * | 5/1998 | Mangelsdorf | ............... 330/133 |
| 5,880,631 A | * | 3/1999 | Sahota | ........................ 330/51 |
| 5,886,579 A | | 3/1999 | Mangelsdorf | |
| 5,952,880 A | * | 9/1999 | Voorman et al. | ............. 330/254 |
| 6,259,321 B1 | * | 7/2001 | Song et al. | .................. 330/254 |

FOREIGN PATENT DOCUMENTS

| KR | 2001-47751 | 6/2001 | ............. H03F/3/04 |
|---|---|---|---|

\* cited by examiner

*Primary Examiner*—Patricia Nguyen
(74) *Attorney, Agent, or Firm*—Jacobson Holman PLLC (57) ABSTRACT

An exponential function generator embodied by a CMOS process and a variable gain amplifier (VGA) employing the same. Since it is difficult for CMOS devices to attain an exponential function by themselves, the exponential function generator employs a scheme of generating two voltage signals varying with different slopes for a control voltage and summing up the two voltage signals so as to obtain an approximated exponential function. Further, the VGA is designed capable of being implemented by the CMOS process and performs only fixed gain amplification at an input stage by considering the deterioration of features of CMOS devices, linearly changes the gain by providing an exponential control current to a variable gain cell performing the practical gain variation for its bias control, and constructs a load by using FETs operating in an ohmic region to perform a stabilized operation regardless of variations in external factors.

17 Claims, 9 Drawing Sheets

EXPONENTIAL FUNCTION GENERATOR EMBODIED BY USING A CMOS PROCESS AND VARIABLE GAIN AMPLIFIER EMPLOYING THE SAME

FIELD OF THE INVENTION

The present invention relates to a semiconductor circuit technology and, more particularly, to an exponential function generator and a variable gain amplifier (VGA) employing the same.

DESCRIPTION OF RELATED ART

In a wireless communication system, a receiver may receive a signal that experiences wide variations in signal power. In receivers such as are used in a wideband digital code division multiple access (CDMA) mobile station, it is necessary to control the power of the demodulated signal for proper signal processing. Moreover, in transmitters such as are used in a CDMA mobile station, it is indispensable to control the transmit power in order to avoid excessive interference to other mobile stations. These same power control considerations apply to narrowband analog frequency modulation (FM) wireless communication system transmitters and receivers.

Dual-mode CDMA/FM wireless communications systems should provide power control of transmitted and received signals of both digital CDMA and analog FM modulation. In these dual-mode mobile stations, the control process is complicated by the differing dynamic ranges and industry regulation standards associated with the CDMA and FM signals. Therefore, the provision of separate automatic gain control (AGC) circuitry for both the CDMA and the FM signals increases the complexity and expense of such dual-mode mobile stations. Accordingly, it is desired to provide AGC circuitry capable of operating upon both the CDMA and FM signals.

A variable gain amplifier (VGA), which is one of the AGC circuits, provides a gain in proportion to a control voltage. The VGA provides an exponential voltage gain as a function of linear increases in the applied control voltage thereby providing an approximately linear power gain in decibels (dB) in direct proportion to linear increases in the applied control voltage. The VGA can be used in many applications including receivers and transmitters.

Figure 1:
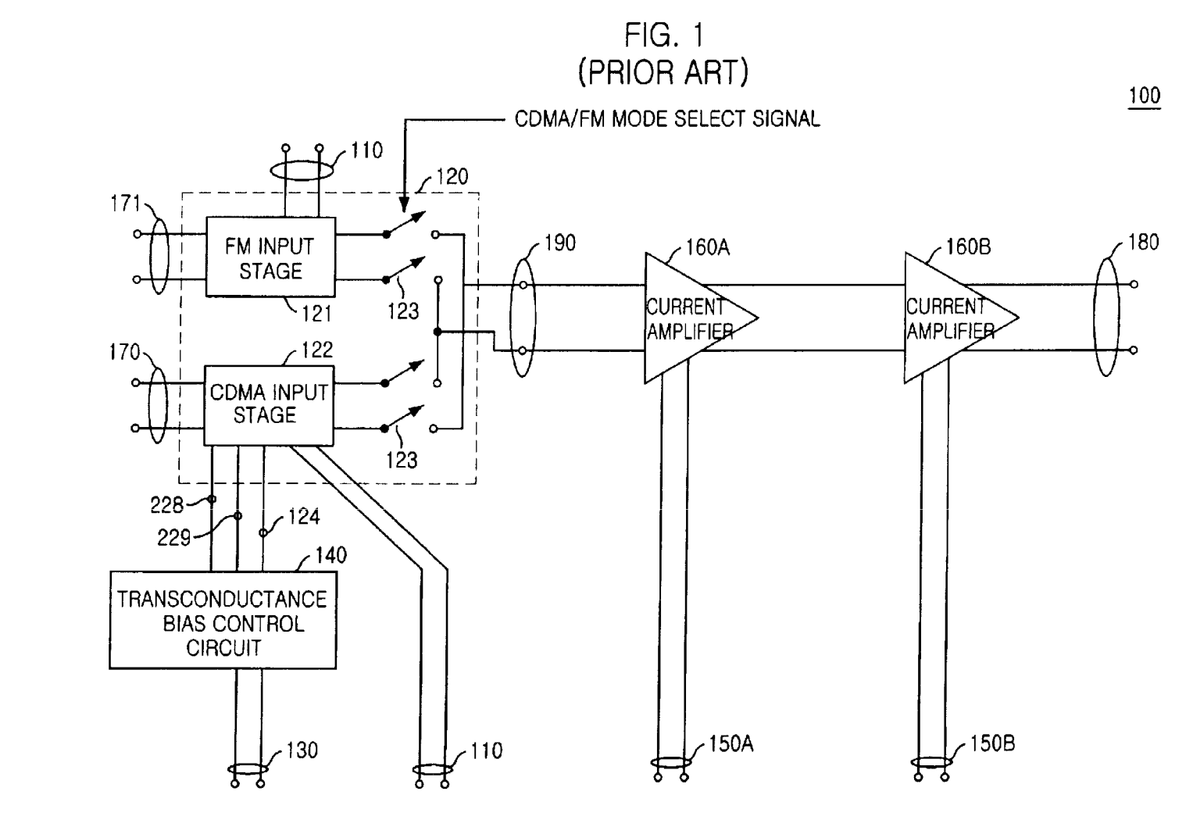
FIG. 1 shows a block diagram of a conventional variable gain amplifier included in a receiver of a dual-mode CDMA/FM mobile station.

Referring to FIG. 1, there is shown a block diagram of a conventional variable gain amplifier (VGA) 100 included in a receiver of a dual-mode CDMA/FM mobile station, which is found in U.S. Pat. No. 5,880,631, entitled "HIGH DYNAMIC RANGE VARIABLE GAIN AMPLIFIER" issued Mar. 9, 1999, and briefly summarized herein as representative of the prior art.

As shown in FIG. 1, the VGA 100 comprises an input stage 120 and two cascaded current amplifiers 160A and 160B. The current amplifiers 160A and 160B are successively cascaded to increase the dynamic range of the VGA 100 and the number of current amplifiers can be adjusted, as necessity requires.

The input stage 120 includes a separate FM input stage 121 and CDMA input stage 122 with respective input ports 171 and 170. The FM input stage 121 and the CDMA input stage 122 are alternately connected to the current amplifier 160A through switches 123, which are controlled by a CDMA/FM mode select signal.

The VGA 100 also employs bias ports 110, 130, 150A and 150B for control voltages to be applied to the VGA 100. The gain of each stage is controlled by control voltages, which, for example, may be generated by receiver detection circuitry that determines the signal strength. Each stage is comprised of a variety of components, including an active device such as a transistor.

Since it operates with a low supply voltage, about 3.6 V, the input stage 120 converts an input voltage signal to a current signal to prevent the VGA active devices from operating in their non-linear region, and distorting the input signal.

Meanwhile, FIG. 1 provides the bias port 130 coupled to a transconductance bias control circuit 140, which will be described later.

Figure 2:
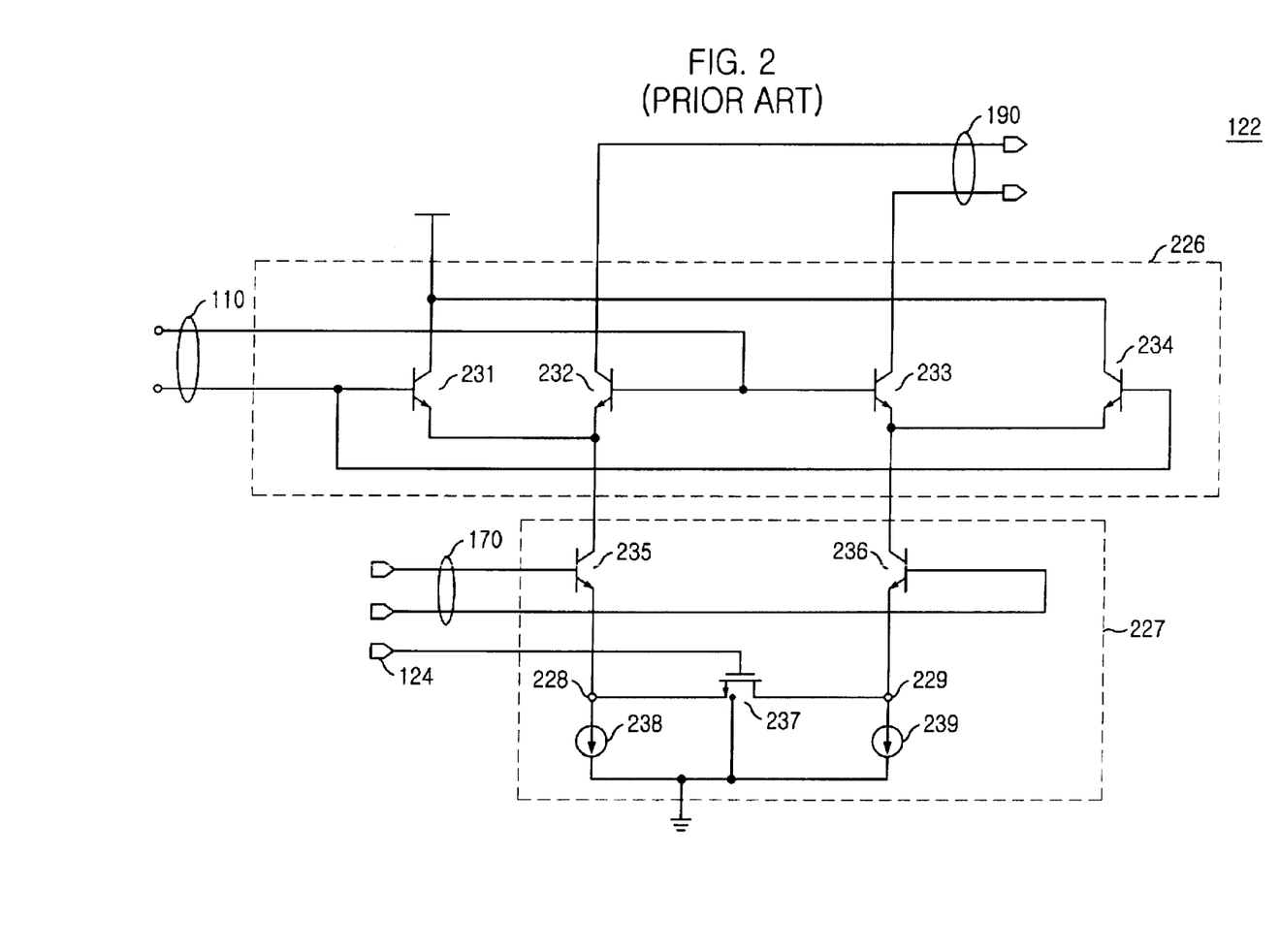
FIG. 2 provides a circuit diagram of the CDMA input stage of FIG. 1.

Referring to FIG. 2, there is shown a diagram of the CDMA input stage 122 of FIG. 1, which includes a Gilbert cell attenuator 226 and a variable transconductance amplifier 227 and serves four functions.

First, the variable transconductance amplifier 227 converts the input voltage signal to a current signal. Second, the combination of the variable transconductance amplifier 227 and the Gilbert cell attenuator 226 permits variable amplification of the signal, which may be varied exponentially by linearly adjusting control voltages at the bias port 110. Third, increased emitter degeneration in the variable transconductance amplifier 227 reduces the intermodulation distortion (IMD) of the VGA 100 when the input voltage signal is large and the IMD would be most prominent. That is, as the emitter degeneration in the variable transconductance amplifier 227 is increased, the transconductance, and thus the IMD, of the CDMA input stage 122 is decreased. Fourth, decreased emitter degeneration in the variable transconductance amplifier 227 improves the noise feature of the VGA 100 when the input voltage signal is small and noise performance is the most critical. Namely, as the emitter degeneration in the variable transconductance amplifier 227 is decreased, the transconductance of the CDMA input stage 122 is increased, improving the noise feature of the receiver.

The variable transconductance amplifier 227 is comprised of two bipolar junction transistors (BJTs) 235 and 236, two current sources 238 and 239, and a field effect transistor (FET) 237. The current sources 238 and 239 are serially connected to the emitters of the BJTs 235 and 236, respectively. The source connection 228 and drain connection 229 of the FET 237 are respectively connected to the emitters of the BJTs 235 and 236. The balanced signal at the VGA input port 170 is applied to the bases of the BJTs 235 and 236. The balanced current output of the variable transconductance amplifier 227 flows from the collectors of the BJTs 235 and 236.

The transconductance of the variable transconductance amplifier 227 may be adjusted by varying the emitter degeneration of the BJTs 235 and 236. As a result, the gain of the VGA 100 may be varied. The emitter degeneration of the BJTs 235 and 236 is created by varying the channel resistance of the FET 237. The FET 237 is operated like a variable resistor in its ohmic region and provides variable emitter degeneration for both of the BJTs 235 and 236. The drain-source bias voltage of the FET 237 must therefore be less than the knee voltage of the FET 237. The channel resistance may be varied by adjusting the bias across the gate-source junction of the FET 237 by varying the voltage applied at a bias port 124. The transconductance of the variable transconductance amplifier 227 can be increased by decreasing the channel resistance of the FET 237.

The differential output currents of the variable transconductance amplifier 227 are coupled to the Gilbert cell attenuator 226. The Gilbert cell attenuator 226 varies the current amplitude of a signal applied to its inputs. The Gilbert cell attenuator 226 contains a first pair of BJTs 231 and 234, and a second pair of BJTs 232 and 233. The attenuation level of the Gilbert cell attenuator 226 is established by a control voltage applied at the bias port 110.

The Gilbert cell attenuator 226 attenuates the output current of the variable transconductance amplifier 227 when the first pair of BJTs 231 and 234 are biased by the control voltage applied to the bias port 110 so that a component of the variable transconductance amplifier's output current flows through the first pair of BJTs 231 and 234 rather than through the second pair of BJTs 232 and 233. Hence the balanced currents at an output port 190 of the Gilbert cell attenuator 226 are diminished.

The configuration of the FM input stage 121 is similar to that of the CDMA input stage 122 described in FIG. 2 except that the FET 237 is replaced by a fixed resistance. As previously mentioned, the fixed resistance of the FM input stage 121 provides a fixed transconductance because industry standards, such as IS-95, allow compression of the input signal at a much lower input level than that of the CDMA input signal.

Figure 3:
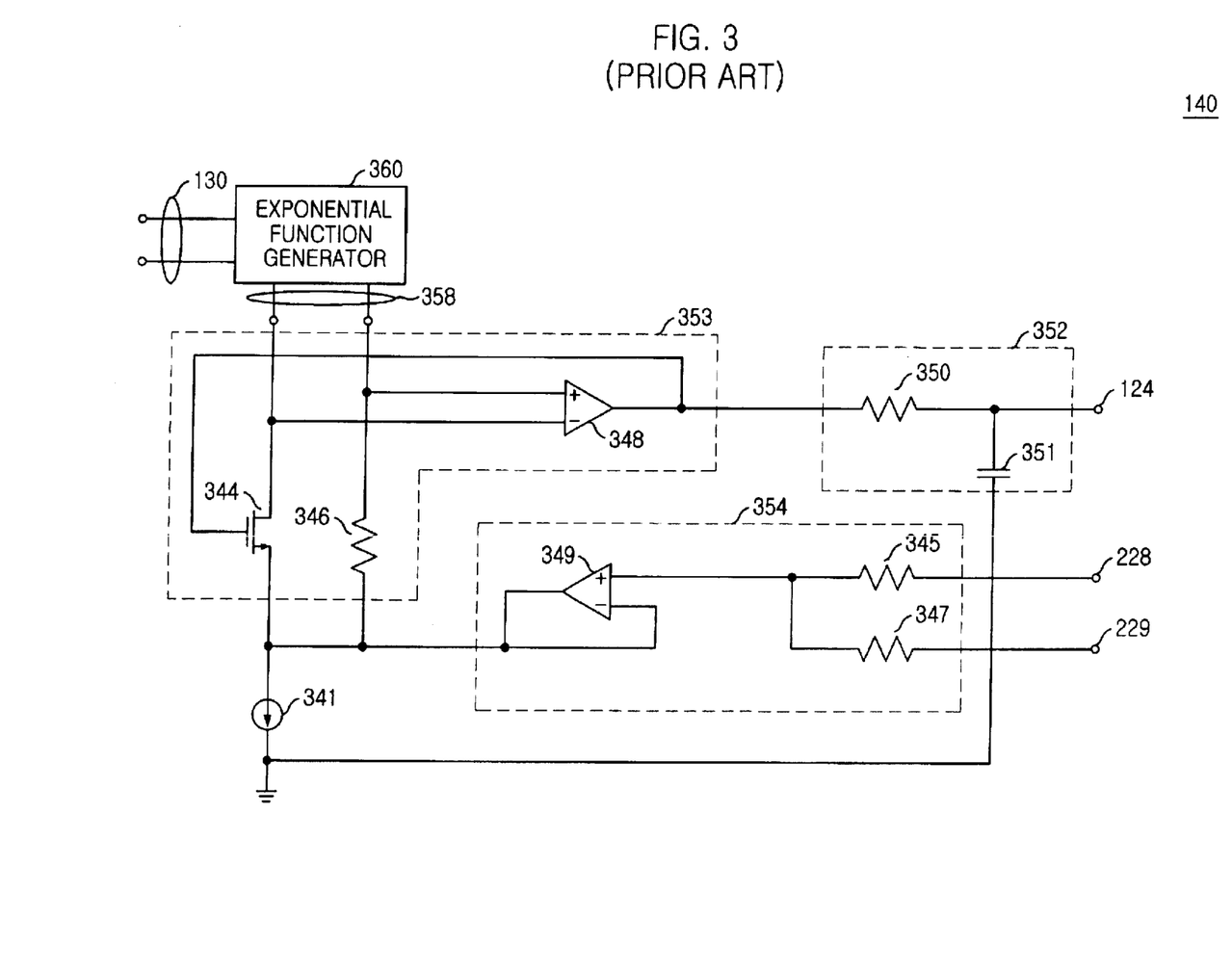
FIG. 3 describes a circuit diagram of the transconductance bias control circuit of FIG. 1.

Referring to FIG. 3, there is provided a diagram of the transconductance bias control circuit 140 of FIG. 1.

As shown in FIG. 3, the transconductance bias control circuit 140 includes an exponential function generator 360, a first and a second operational amplifier circuit 353 and 354, a low pass filter 352 and a current source 341.

The exponential function generator 360 converts the control voltage applied at the bias port 130 to two output currents flowing from an output node 358 of the exponential function generator 360 to the first operational amplifier circuit 353. The ratio of the amplitudes of these currents is exponentially proportional to the control voltage.

Figure 4:
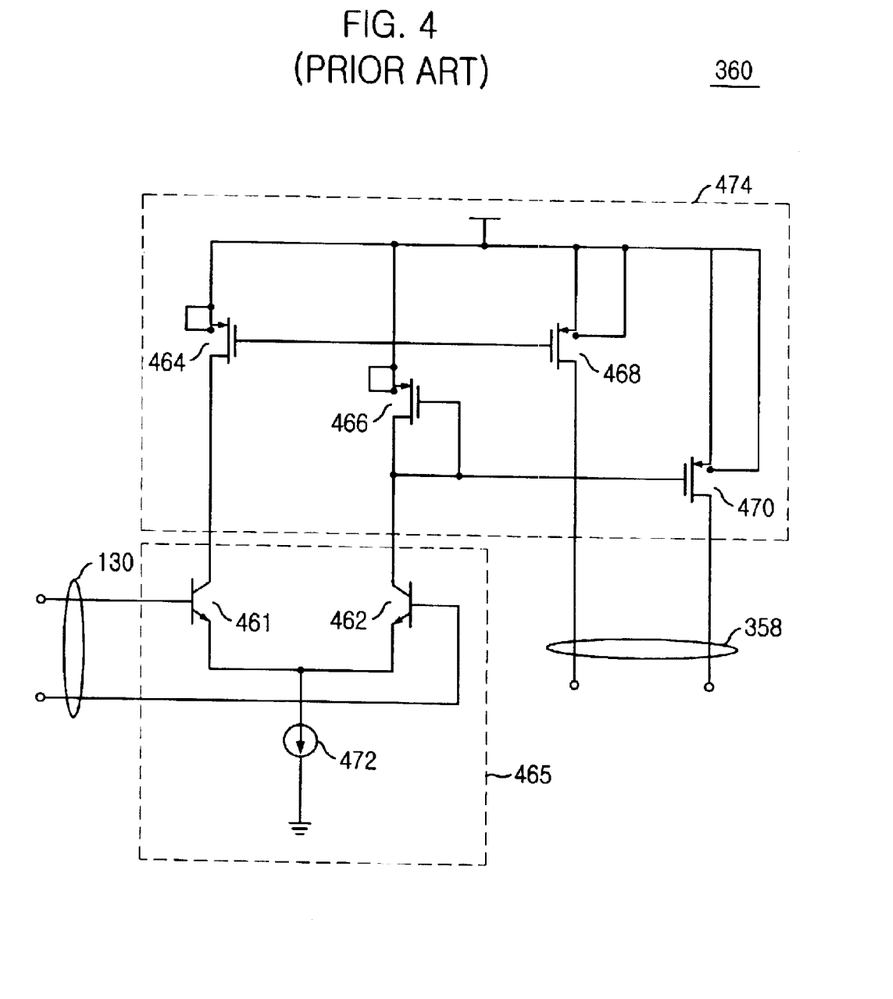
FIG. 4 is a circuit diagram of the exponential function generator of FIG. 3.

Referring to FIG. 4, there is illustrated a diagram of the exponential function generator 360, which comprises a differential amplifier 465 provided with the control voltage at the bias port 130 and a pair of FET current mirrors 474 driven by outputs of the differential amplifier 465. The differential amplifier 465 includes a parallel pair of BJTs 461 and 462 whose bases are connected to the bias port 130 and a current source 472 connected to the pair of BJTs 461 and 462. The pair of FET current mirrors 474 includes four FETs 464, 466, 468 and 470. Due to an exponential input voltage-output current relationship of the BJTs 461 and 462, the ratio of their collector currents is proportional to the differential base voltage between the BJTs 461 and 462, which is determined by the control voltage signal. Thus, the linear differential voltage change across the bias port 130 is translated to an exponentially related current at the output node 358. The current mirrors 474 simply take the exponentially related current generated by the pair of BJTs 461 and 462 and provide it for use throughout the differential amplifier 465.

Referring back to FIG. 3, the first and the second operational amplifier circuits 353 and 354 act in cooperation with the exponential function generator 360 to control the channel resistance of the FET 237 of FIG. 2. The first operational amplifier circuit 353 employs a master FET 344, which is preferably identical to the FET 237, a reference resistor 346 and a differential operational amplifier 348. The output currents from the exponential function generator 360 are coupled to the master FET 344 and the reference resistor 346. The differential operational amplifier 348 forces the voltage across the drain and source terminals of the master FET 344 and the terminals of the reference resistor 346 to be equal by varying the bias voltage applied to the gate of the master FET 344. The bias voltages applied to the gates of the FET 237 and the master FET 344 are generally equal. However, the gate bias voltage applied to the FET 237 through the bias port 124 is low pass filtered to prevent thermal noise from the transconductance bias control circuit 140 from being injected onto the FET 237. The low pass filtering is accomplished by a low pass filter 352 formed by series resistor 350 and shunt capacitor 351.

The second operational amplifier 354 includes a non-inverting, unity gain operational amplifier 349 and resistors 345 and 347, that sense the drain-source voltage across the FET 237 via the source connection 228 and the drain connection 229. The second operational amplifier circuit 354 forces the master FET 344 and the FET 237 to have the same source voltage.

The exponential function generator 360 and the current source 341 connected around the master FET 344 and the reference resistor 346 are designed so that the voltage drop across the reference resistor 346, and hence across the drain-source of the master FET 344, is less than the FET's knee voltage. As a result, the operation of the first and the second operational amplifier circuits 353 and 354 force the FET 237 and the master FET 344 to operate at similar quiescent points in their ohmic regions. Therefore, the channel resistances of both of the FET 237 and the master FET 344 are generally identical and vary exponentially with a linearly adjusted control voltage applied to the bias port 130.

Figure 5:
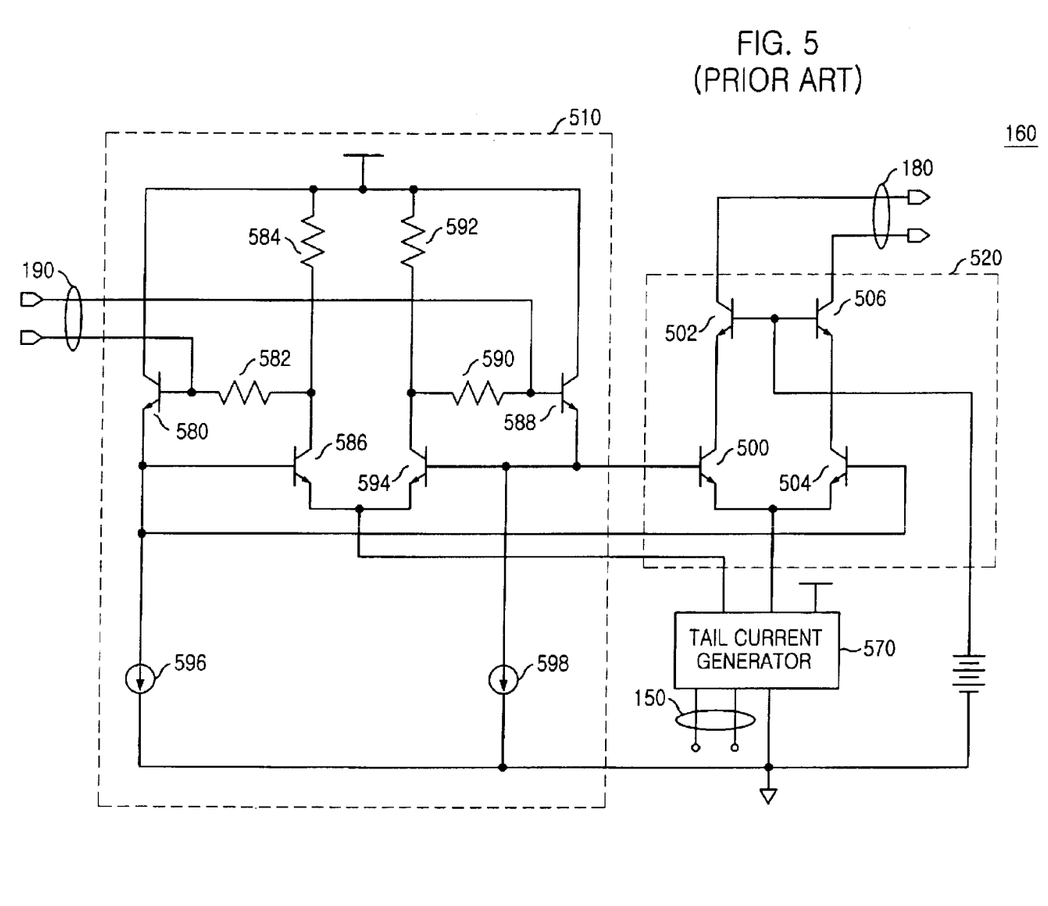
FIG. 5 illustrates a circuit diagram of the current amplifier of FIG. 1.

Referring to FIG. 5, there is illustrated a diagram of the current amplifiers 160A and 160B of FIG. 1. The input of the current amplifier 160 as shown in FIG. 5 may be coupled to the output of the input stage 120 or the output of another current amplifier. The current amplifier 160 comprises a Darlington differential amplifier 510, a cascode differential amplifier 520 and a tail current generator 570. The current amplifier 160 is biased by power supplies and current sources 596 and 598.

The Darlington differential amplifier 510 includes BJTs 580, 586, 588 and 594 and resistors 582, 584, 590 and 592 in the topology shown in FIG. 5 such that the Darlington differential amplifier 510 has a resistive shunt-series feedback to provide an enhanced current gain and process variation insensitivity.

The cascode differential amplifier 520 includes BJTs 500, 502, 504 and 506 in the topology of a differential current mirror, which allows the gain of the current amplifier 160 to be varied by varying tail currents. The cascode differential amplifier 520 provides a translinear loop, which provides variable current amplification according to the ratio of the tail currents generated by the tail current generator 570.

The gain of the current amplifier 160 is controlled by the tail current generator 570. The tail current generator 570, through a differential port, is connected to both of the Darlington differential amplifier 510 and the cascode differential amplifier 520. The current amplification of the current amplifier 160 may be varied exponentially by using the control current generated by the exponential function generator 360 of FIG. 4 and applied to the control ports 150. For reference, the tail current generator 570 includes an exponential function generator and a pair of bipolar current mirrors. Each of the bipolar current mirrors includes a plurality of resistors and a multiplicity of BJTs.

As described above, since the conventional VGA includes BJTs in each component thereof, it is formed by a BiCMOS manufacturing process. In particular, the exponential function generator having exponentially varying gain can readily convert the control voltage to an exponential current by using features of the BJT device itself. Therefore, the reason why the BiCMOS manufacturing process is used instead of a CMOS manufacturing process, even though the CMOS process can achieve low cost of production and high integration, is that it is difficult to implement an appropriate exponential function although a device of a large size is used since the transconductance of a CMOS device is very small and, thus, BJT's are inevitably used. Further, it is difficult to attain BJT features of acting amplification through the use of the CMOS manufacturing process.

Meanwhile, the exponential function generator is widely applied to other analog systems in addition to the beforementioned VGA and, therefore, it is required to form the exponential function generator by using the CMOS manufacturing process.

SUMMARY OF THE INVENTION

It is, therefore, a primary object of the present invention to provide an exponential function generator capable of attaining an appropriate exponential function through the use of a CMOS manufacturing process.

Another object of the present invention is to provide a variable gain amplifier employing the exponential function generator, which can be implemented by a CMOS manufacturing process.

In accordance with one aspect of the present invention, there is provided an exponential function generator comprising a first and a second curve generator for producing signals varying with different slopes by sampling an inputted control voltage; and an adder for summing up the signals outputted from the first and the second curve generators to thereby output a voltage signal having an approximated exponential function value.

In accordance with another aspect of the present invention, there is provided a variable gain amplifier embodied by a CMOS process, comprising an input stage for amplifying differential input signals to thereby output voltage signals having a limited fixed gain value; an exponential function generator including a first and a second curve generator which produce signals varying with different slopes by sampling an inputted control voltage, and summing up the signals outputted from the first and the second curve generators to thereby output a signal having an approximated exponential function value; a control current generator for producing an exponential control current in response to the output signal of the exponential function generator; and a variable voltage amplifier for performing variable gain amplification of the voltage signal outputted from the input stage in response to the exponential control current.

In accordance with the present invention, the exponential function generator is implemented by using a CMOS manufacturing process. Since it is difficult for CMOS devices to attain an exponential function by themselves, the present invention employs a scheme of generating two voltage signals varying with different slopes for a control voltage and summing up the two voltage signals so as to obtain an approximated exponential function. Meanwhile, in accordance with the present invention, the VGA including the inventive exponential function generator is designed capable of being implemented by employing the CMOS manufacturing process. That is, the present invention performs only fixed gain amplification at an input stage by considering the deterioration of features of CMOS devices, linearly changes the gain by providing an exponential control current to a variable gain cell, e.g., a differential voltage amplifier, performing the practical gain variation for the bias control of the variable gain cell, and constructs a load by using FETs operating in an ohmic region to perform a stabilized operation regardless of variations in external factors such as temperature, manufacturing processes and so on.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, some preferred embodiments of the present invention will be described in detail with reference to the accompanying drawings.

Figure 6:
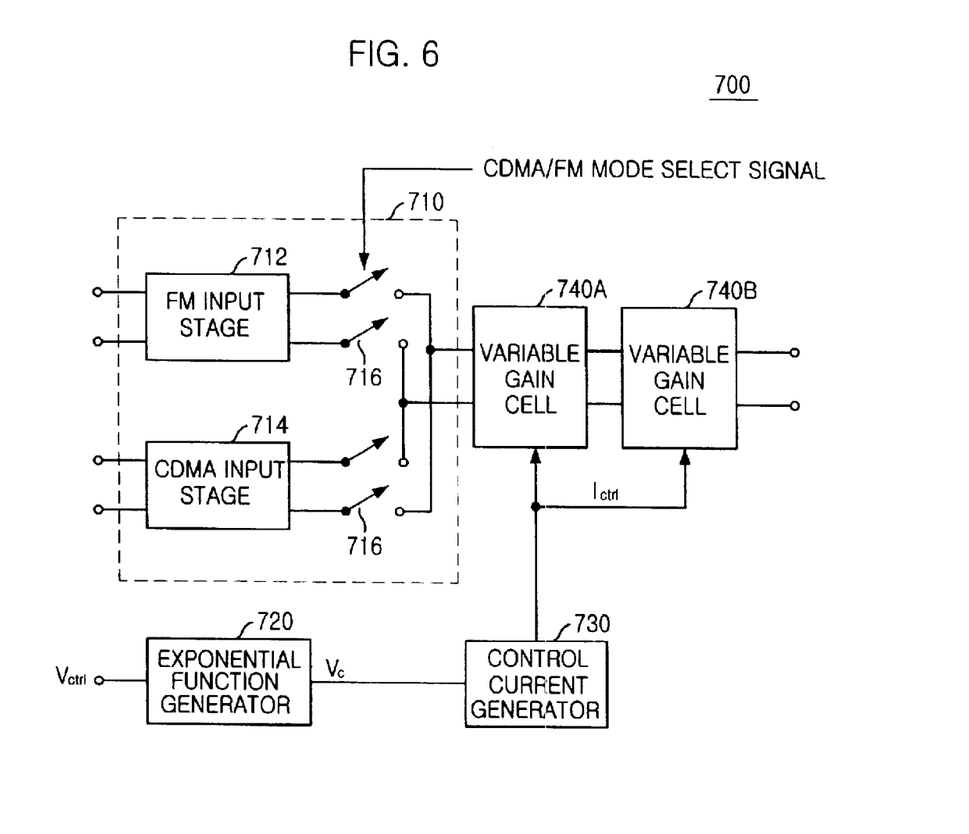
FIG. 6 represents a block diagram of a variable gain amplifier in accordance with the present invention.

Referring to FIG. 6, there is illustrated a block diagram of a variable gain amplifier (VGA) 700 in accordance with an embodiment of the present invention.

The VGA 700 comprises an input stage 710, an exponential function generator 720, a control current generator 730 and two variable gain cells 740A and 740B.

The input stage 710 includes an FM input stage 712 operating in an FM mode, a CDMA input stage 714 operating in a CDMA mode and switches 716 for alternately connecting the FM input stage 712 and the CDMA input stage 714 to the variable gain cell 740A under the control of an CDMA/FM mode select signal. Herein, the FM input stage 712 and the CDMA input stage 714 are implemented as differential amplifiers made by a CMOS manufacturing process and perform fixed gain amplification to a degree that will not degrade the noise feature and the distortion feature of an inputted FM/CDMA signal. The fixed gain amplification is performed by considering coarse transconductance of a CMOS device. The differential amplifier made by the CMOS manufacturing process is a well-known circuit and, therefore, detailed explanation of the configuration and operation of the differential amplifier will be omitted.

The variable gain cells 740A and 740B in which a gain is practically varied are constructed by a kind of voltage amplifier whose input and output are voltage signals. The variable gain cells 740A and 740B are also embodied by the CMOS manufacturing process and their gains are varied by a semi-exponential control current $I_{ctrl}$.

The exponential function generator 720 converts a control voltage $V_{ctrl}$ to an exponential function and is also implemented by the CMOS manufacturing process.

The control current generator 730 is provided with an exponential voltage $V_c$ outputted from the exponential function generator 720 to thereby produce the control current $I_{ctrl}$, and is implemented by the CMOS manufacturing process.

Figure 7:
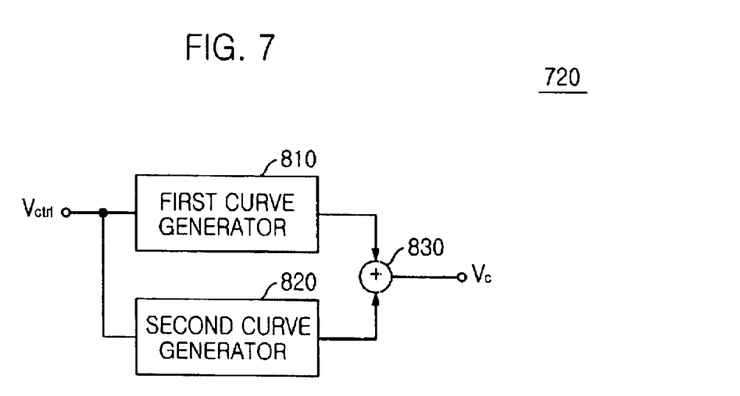
FIG. 7 depicts a block diagram of the exponential function generator of FIG. 6.

Referring to FIG. 7, there is depicted a block diagram of the exponential function generator 720 of FIG. 6.

The exponential function generator 720 includes a first and a second curve generator 810 and 820 and an adder 830 for summing up the output voltages from the curve generators 810 and 820. The first and the second curve generators 810 and 820 produce voltage signals varying with different slopes for the control voltage $V_{ctrl}$, and the adder 830 employs a scheme of summing up the voltage signals outputted from the first and the second curve generators 810 and 820 to thereby produce an approximated exponential function, considering CMOS features.

Figure 8:
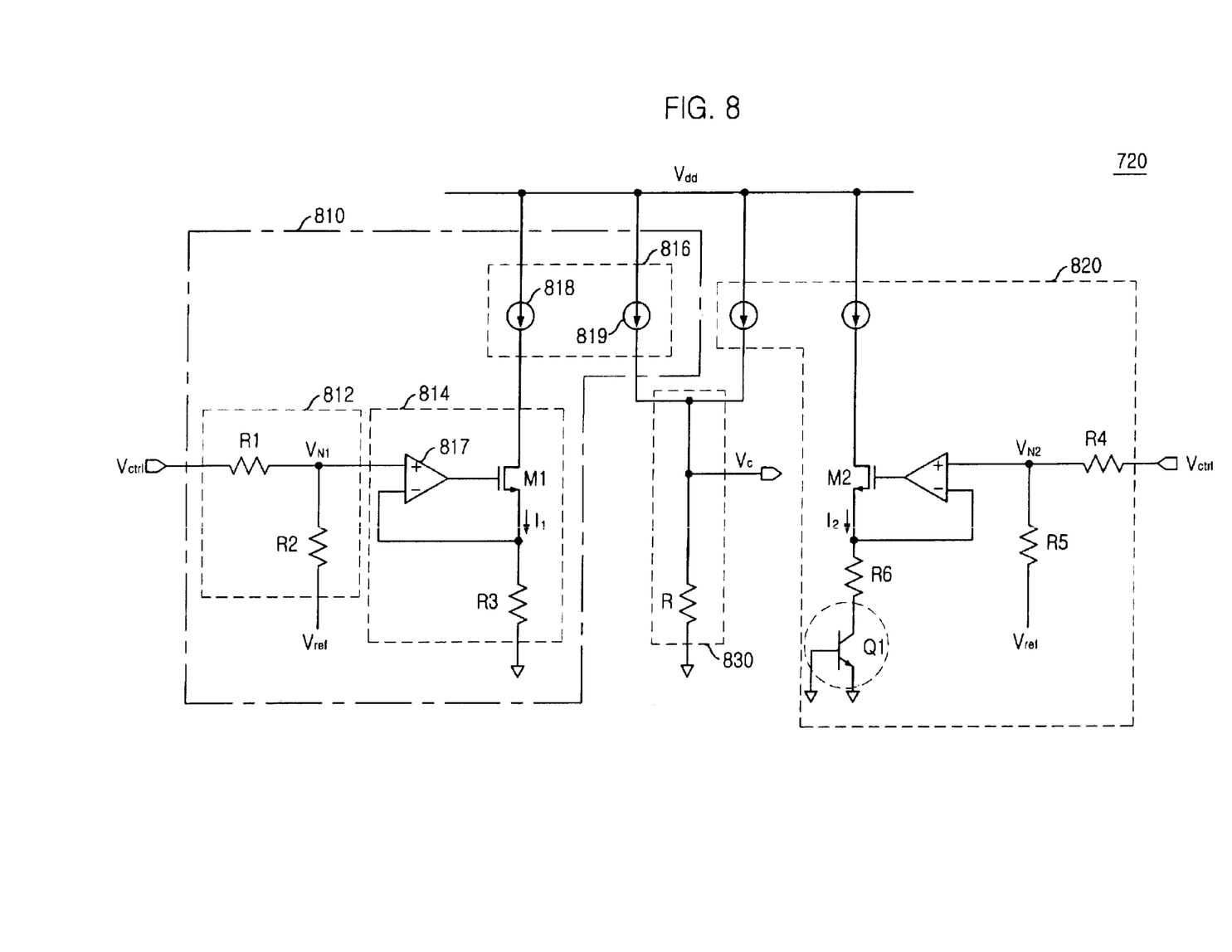
FIG. 8 is a circuit diagram of the exponential function generator of FIG. 6.

Referring to FIG. 8, there is shown a circuit diagram of the exponential function generator 720 of FIG. 6.

The first curve generator 810 includes a level shifter 812 for changing the level of the control voltage $V_{ctrl}$, a V-I converter 814 for converting an output voltage from the level shifter 812 to a current, and a current mirror 816.

The level shifter 812 contains a resistor R1 connected between the control voltage $V_{ctrl}$ and an output node $V_{N1}$ and a resistor R2 connected between a reference voltage $V_{ref}$ and the output node $V_{N1}$.

The current mirror 816 includes two current sources 818 and 819 connected in parallel to a supply voltage $V_{dd}$.

The V-I converter 814 has an operational amplifier 817 receiving the output voltage $V_{N1}$ of the level shifter 812 as its positive input, an FET M1 whose gate is supplied with an output of the operational amplifier 817, and a resistor R3 connected between a drain of the FET M1 and a ground voltage node. The drain of the FET M1 is also attached to a negative input node of the operational amplifier 817 and a source of the FET M1 is connected to the current source 818.

In the meantime, the second curve generator 820 has a symmetric configuration with that of the first curve generator 810 except it employs a parasitic PNP BJT Q1. Since the parasitic PNP BJT Q1 does not perform the amplification and, thus, does not require superior features, it can be easily embodied by the CMOS manufacturing process.

The adder 830 adds an output of the current source 819 to an output of a corresponding current source of the second curve generator 820 to thereby output the exponential voltage $V_c$ and employs an output resistor R connected between the exponential voltage $V_c$ node and the ground voltage node.

As illustrated above, in the exponential function generator 720, a current $I_1$ flowing through the resistor R3 of the first curve generator 810 can be represented as $V_{N1}/R3$. On the other hand, a current I2 flowing through a resistor R6 of the second curve generator 820 becomes a non-linear function for the control signal $V_{ctrl}$ by the parasitic PNP BJT Q1 connected between the resistor R6 and the ground voltage node. The parasitic PNP BJT Q1 does not operate until the level shifter output voltage $V_{N2}$ of the second curve generator 820 is over a threshold voltage. The parasitic PNP BJT Q1 has a very small turn-on resistance because of its diode feature. Therefore, the current $I_2$ is approximated to $V_{N2}/R6$.

Meanwhile, the output voltage $V_c$ of the exponential function generator 720 can be represented as $(I_1+I_2) \times R$, which has an independent semi-exponential value of external factors such as temperature, manufacturing processes and so on by sampling the control voltage $V_{ctrl}$ to respective different values according to a resistance ratio of the first and the second curve generators 810 and 820.

Figure 9:
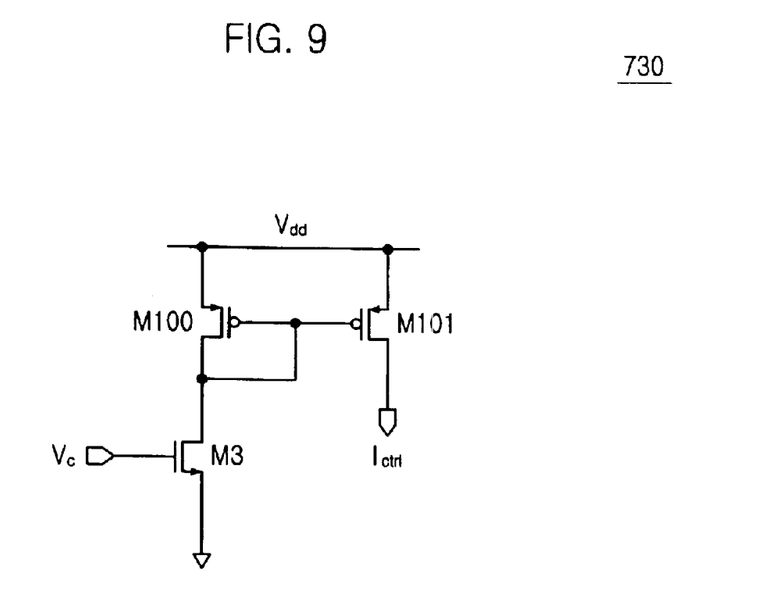
FIG. 9 shows a circuit diagram of the control current generator of FIG. 6.

In FIG. 9, there is shown a circuit diagram of the control current generator 730 of FIG. 6, which is implemented by the CMOS manufacturing process.

The control current generator 730 includes a FET M3 whose gate is provided with the exponential voltage $V_c$ outputted from the exponential function generator 720 and two FETs M100 and M101 constructing a current mirror. A current flowing through the FET M100 varies depending on the exponential voltage $V_c$ coupled to the FET M3 and a current mirrored to the FET M101 is varied and outputted as a control current $I_{ctrl}'$.

Figure 10:
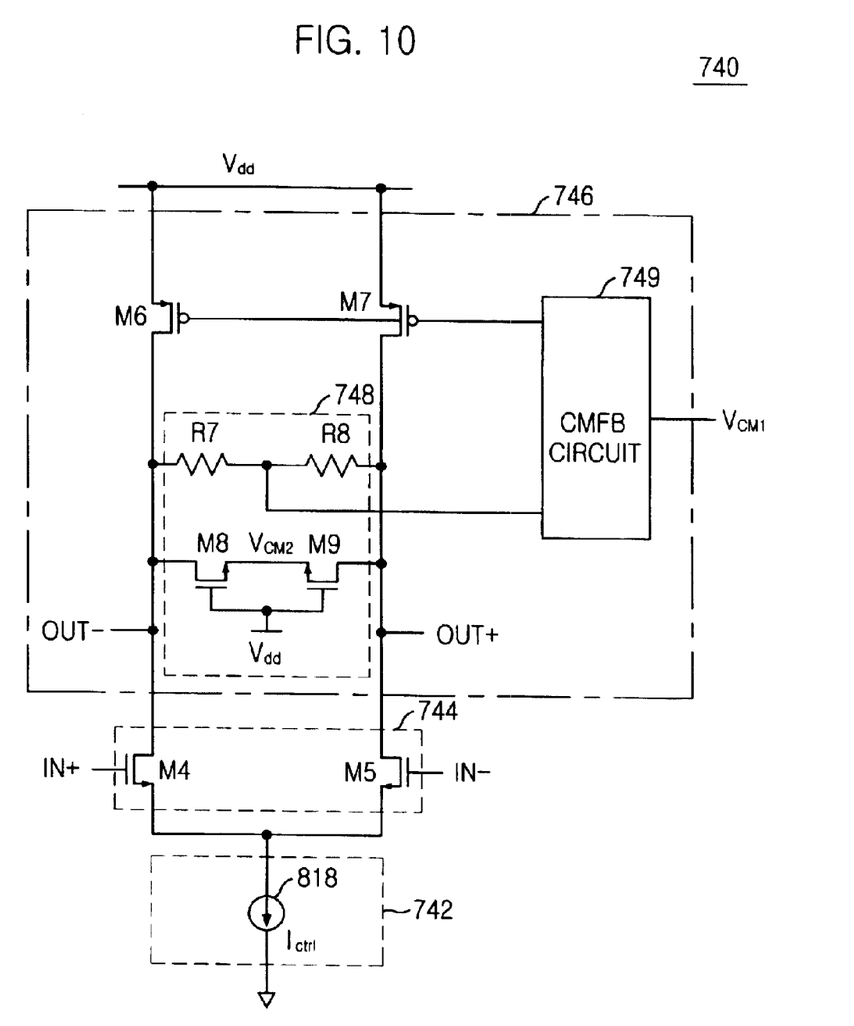
FIG. 10 describes a diagram of the variable gain cell of FIG. 6.

Referring to FIG. 10, there is described a circuit diagram of the variable gain cells 740A and 740B of FIG. 6, which are also constructed by the CMOS manufacturing process.

The variable gain cell 740 has a differential amplifier structure including a bias control unit 742, a voltage input unit 744 and a load unit 746. The bias control unit 742 uses the control current $I_{ctrl}$ outputted from the control current generator 730 as a current source and the voltage input unit 744 includes two FETs M4 and M5 whose gates are provided with differential input voltages IN+ and IN−, respectively. The load unit 746 contains an effective load part 748, a common mode feedback (CMFB) circuit 749 and two FETs M6 and M7 whose gates are supplied with an output of the CMFB circuit 749. The effective load part 748 is composed of two resistors R7 and R8 connected between drains of the FETs M6 and M7, and two FETs M8 and M9. A node between the two resistors R7 and R8 is connected to an input node of the CMFB circuit 749 and a node between the FETs M8 and M9 is attached to a second constant voltage $V_{CM2}$. Further, gates of the FETs M8 and M9 are commonly connected to the supply voltage $V_{dd}$. In this drawing, OUT+ and OUT− represent differential output voltages.

For reference, the CMFB circuit 749 uses a first and the second constant voltage $V_{CM1}$ and $V_{CM2}$ for the bias; receives a voltage at the node between the two resistors R7 and R8 of the effective load part 748, wherein, practically, the resistors R7 and R8 have the same resistance; compares the received voltage with the first constant voltage $V_{CM1}$; and controls the operation of the FETs M6 and M7 connected to its output node according to the comparison result to thereby allow the node between the resistors R7 and R8 whose voltage is represented as [(Vout+)+(Vout−)]/2 to maintain the first constant voltage $V_{CM1}$. That is, according to the operation of the CMFB circuit 749, the node between two resistors R7 and R8 maintains its state like an AC ground state.

In the variable gain cell 740 configured as described above, if the FETs M4 and M5 of the voltage input unit 744 are allowed to operate in their saturation regions, a voltage gain of the variable gain cell 740 can be represented as the product of a transconductance value gm of the FETs M4 and M5 and an effective resistance $R_{eff}$ of the effective load part 748. The voltage gain Av of the variable gain cell 740 is described in an equation, EQ. 1.

$$Av = gm_{M4} \cdot R_{eff} \qquad \text{EQ. 1}$$

$$= \sqrt{I_{ctrl} \cdot \mu_n Cox(W/L)_{M4} \cdot R_{eff}}$$

Herein, $gm_{M4}$ represents the transconductance of the FET M4; $\mu_n$ depicts mobility of an NMOS transistor; Cox is capacitance of a gate oxide film of the FET M4; and $(W/L)_{M4}$ means a ratio of a channel width W to a channel length L of the FET M4.

Meanwhile, the effective resistance $R_{eff}$ is shown in an equation, EQ. 2.

$$R_{eff} = R_{0,M6} \| R7 \| R_{ds,M8} \qquad \text{EQ. 2}$$

$$= R_{ds,M8}, \quad (R_{ds,M8} \ll R7 \ll R_{0,M6})$$

$$= \frac{1}{\mu_n Cox(W/L)_{M8}(V_{dd} - V_{CM2} - V_{TN})}$$

In EQ. 2, $R_{0,M6}$ means an output resistance of the FET M6; $R_{ds,M8}$ is a drain-source resistance of the FET M8; and $V_{TN}$ represents a threshold voltage of an NMOS transistor. Therefore, the equation EQ. 1 can be modified to an equation, EQ. 3.

$$Av = \frac{\sqrt{I_{ctrl} \cdot \mu_n Cox(W/L)_{M4}}}{\mu_n Cox(W/L)_{M8}(V_{dd} - V_{CM2} - V_{TN})} \qquad \text{EQ. 3}$$

At this time, since the transconductance value gm is described in a square root, the voltage gain Av of the variable gain cell 740 cannot have linearity. Accordingly, the control current $I_{ctrl}$ is produced by processing the exponential voltage $V_c$ generated from the exponential function generator 720 at the control current generator 730 in order to linearize the voltage gain Av. Namely, if the FET M3 of the control current generator 730 is designed to operate in a saturation region for a sufficiently wide input voltage range, a square law current of the FET M3 is generated and the output current $I_{ctrl}'$ of the control current generator 730 can be described as shown in an equation, EQ. 4, since the input of control current generator 730 is the exponential voltage $V_c$.

$$I_{ctrl}' = \frac{1}{2}\mu_n Cox(W/L)_{M3}(V_c - V_{TN})^2 \qquad \text{EQ. 4}$$

In the meantime, when using the current $I_{ctrl}'$ as the bias control current $I_{ctrl}$ of the variable gain cell 740 through the use of a current mirror, the voltage gain Av of the variable gain cell 740 is rearranged as described in an equation, EQ. 5.

$$Av = \frac{\mu_n Cox(V_c - V_{TN})}{\mu_n Cox(V_{dd} - V_{CM2} - V_{IN})} \cdot \sqrt{\frac{1}{2} \cdot \frac{(W/L)_{M3}(W/L)_{M4}}{(W/L)_{M8}(W/L)_{M8}}} \qquad \text{EQ. 5}$$

$$= \sqrt{\frac{1}{2} \cdot \frac{(W/L)_{M3}(W/L)_{M4}}{(W/L)_{M8}(W/L)_{M8}}} \cdot \frac{(V_c - V_{TN})}{(V_{dd} - V_{CM2} - V_{TN})}$$

Herein, the FET M8 should operate in its ohmic region so as to maintain its stabilized operation regardless of variations in the external factors such as manufacturing processes, temperature and so on, and the drain-source voltage of the FET M8 should be minimized to obtain superior linearity. Since the voltage difference of the first and the second constant voltages $V_{CM1}$ and $V_{CM2}$, which are used in constructing the CMFB circuit 749, becomes the drain-source voltage of the FET M8, it is possible to adjust the linearity.

If the FETs M4 and M5 are allowed to operate in their saturation regions, their noise features are also improved and the voltage gain of the variable gain cell 740 shows an independent value of the external factors such as the temperature and the manufacturing process. Meanwhile, it is not necessarily required that the gate voltage of the FET M8 be the supply voltage $V_{dd}$ and its value is determined to allow the FET M8 to operate in the ohmic region.

In accordance with the above embodiment, there is exemplified the exponential function generator applied to the VGA. However, the present invention is applicable to the case in which the exponential function generator is used in other analog systems.

In accordance with the present invention, since the exponential function generator is implemented by the CMOS manufacturing process, it is possible to reduce the cost of production and increase the integration. Further, although the inventive exponential function generator and the VGA using the same are made through the use of the CMOS manufacturing process, they are independent of variations in the external factors such as the temperature and the manufacturing process, and their productivity becomes superior. Moreover, since the inventive VGA uses the control current $I_{ctrl}$ as the bias current source of the variable gain cell, there is obtained an advantage of reducing the current consumption by using the current variation according to the gain.

While the present invention has been described with respect to the particular embodiments, it will be apparent to those skilled in the art that various changes and modifications may be made without departing from the spirit and scope of the invention as defined in the following claims.

What is claimed is:

1. An exponential function generator, comprising:
   first curve generating means for producing a first signal by sampling an inputted control voltage;
   second curve generating means for producing a second signal by sampling the inputted control voltages; and
   adding means for summing up the first and second signals outputted from the first and the second curve generating means to thereby output a voltage signal having an approximated exponential function value,
   wherein the first and second signals vary with different slopes.

2. The exponential function generator as recited in claim 1, wherein the first curve generating means includes:
   first level shifting means for changing a voltage level of the control voltage;
   a first current mirror biased by a supply voltage; and
   first V-I converting means, connected between the first current mirror and a ground voltage node, for receiving and converting an output voltage of the first level shifting means to a current.

3. The exponential function generator as recited in claim 2, wherein the second curve generating means includes:
   second level shifting means for changing the voltage level of the control voltage;
   a second current mirror biased by the supply voltage;
   second V-I converting means, connected to the second current mirror, for receiving and converting an output voltage of the second level shifting means to a current; and
   a parasitic bipolar component which is connected between the second V-I converting means and the ground voltage node and formed by a CMOS process and whose gate is provided with the ground voltage.

4. The exponential function generator as recited in claim 3, wherein the adding means includes a resistor connected between an output node of the exponential function generator and the ground voltage node, and sums up outputs of the first and the second current mirrors.

5. The exponential function generator as recited in claim 3, wherein each of the first and the second level shifting means has:
   a first resistor connected between a control voltage node and an output node of the respective level shifting means; and
   a second resistor connected between a reference voltage node and said output node.

6. The exponential function generator as recited in claim 5, wherein each of the first and the second V-I converting means has:
   an operational amplifier for receiving an output signal of a respective level shifting means as its positive input;
   a field effect transistor (FET) having a gate provided with an output of the operational amplifier, a source connected to the respective current mirror and a drain attached to a negative input node of the operational amplifier; and
   a resistor connected between the drain of the FET and the ground voltage node.

7. The exponential function generator as recited in claim 6, wherein each of the first and the second current mirrors has:
   a first current source connected between a supply voltage node and the source of the FET; and
   a second current source connected between the supply voltage node and the output node of the exponential function generator.

8. The exponential function generator as recited in claim 3, wherein the first and the second curve generating means are formed by using the CMOS process.

9. A variable gain amplifier embodied by a CMOS process, comprising:
   input means for amplifying differential input signals to thereby output voltage signals having a limited fixed gain value;
   exponential function generating means including a first curve generating means for producing a first signal and a second curve generating means for producing a second signal, wherein the first and second signals vary with different slopes by sampling an inputted control voltage;
   an adder for summing up the first and the second signals outputted from the first and the second curve generating means to thereby output a signal having an approximated exponential function value;
   control current generating means for producing an exponential control current in response to the output signal of the exponential function generating means; and
   variable voltage amplifying means for performing variable gain amplification of the voltage signal outputted from the input means in response to the exponential control current.

10. The variable gain amplifier of claim 9, wherein the first curve generating means of the exponential function generating means includes:
    first level shifting means for changing a voltage level of the control voltage;
    a first current mirror biased by a supply voltage; and
    first V-I converting means, connected between the first current mirror and a ground voltage node, for receiving and converting an output voltage of the first level shifting means to a current.

11. The variable gain amplifier of claim 10, wherein the second curve generating means of the exponential function generating means includes:
    second level shifting means for changing the voltage level of the control voltage;
    a second current mirror biased by the supply voltage;
    second V-I converting means, connected to the second current mirror, for receiving and converting an output voltage of the second level shifting means to a current; and
    a parasitic bipolar component which is connected between the second V-I converting means and the ground voltage node and formed by the CMOS process and whose gate is provided with the ground voltage.

12. The variable gain amplifier of claim 9, wherein the control current generating means includes:
    an effect transistor (FET) whose gate is provided with the output signal of the exponential function generating means; and
    a current mirror for outputting the exponential control current by mirroring a current flowing through the FET.

13. The variable gain amplifier of claim 9, wherein the variable voltage amplifying means includes:
    bias control means using the exponential control current as a current source;
    signal input means receiving the voltage signals outputted from the input means as differential input signals; and
    loading means connected between a supply voltage node and differential output nodes of the variable voltage amplifying means.

14. The variable gain amplifier of claim 13, wherein the signal input means has a first FET and a second FET which are connected between the bias control means and the differential output nodes and operate in their saturation regions and whose gates are provided with the voltage signals outputted from the input means.

15. The variable gain amplifier of claim 14, wherein the loading means has an effective load constructed by FETs operating in an ohmic region.

16. The variable gain amplifier of claim 15, wherein the effective load contains:
    a first resistor and a second resistor connected in series between the differential output nodes of the variable voltage amplifying means and having a same resistance; and
    a third FET and a fourth FET connected between the differential output nodes in series and operating in the ohmic region.

17. The variable gain amplifier of claim 16, wherein the loading means further has:
    common mode feedback means for comparing a voltage at a node between the first and the second resistors with a first constant voltage and generating a feedback voltage so as to maintain the voltage level of the node between the first and the second resistors equal to that of the first constant voltage; and
    a fifth FET and a sixth FET which are connected between a supply voltage node and the differential output nodes and whose gates are provided with the feedback voltage,
    wherein the effective load having a node between the third and the fourth FETs is supplied with a second constant voltage whose level is different from that of the first constant voltage.

* * * * *